United States Patent [19]
Ota et al.

[11] Patent Number: 5,147,775
[45] Date of Patent: Sep. 15, 1992

[54] METHOD OF FABRICATING A HIGH-FREQUENCY BIPOLAR TRANSISTOR

[75] Inventors: Yorito Ota, Kobe; Masanori Inada, Nara; Manabu Yanagihara, Kadoma, all of Japan

[73] Assignee: Matsushita Electric Industrial Co., Ltd., Osaka, Japan

[21] Appl. No.: 570,958

[22] Filed: Aug. 21, 1990

Related U.S. Application Data
[62] Division of Ser. No. 424,009, Jul. 25, 1988, abandoned.

[30] Foreign Application Priority Data

Jul. 24, 1987 [JP] Japan .............................. 62-186176
Jul. 24, 1987 [JP] Japan .............................. 62-186181

[51] Int. Cl.⁵ .......................................... H01L 21/265
[52] U.S. Cl. .................................... 437/31; 437/126; 437/133; 148/DIG. 10; 148/DIG. 72
[58] Field of Search .................. 357/34, 58; 437/31, 437/126, 133; 148/DIG. 9, DIG. 10, DIG. 72

[56] References Cited

U.S. PATENT DOCUMENTS
| | | | |
|---|---|---|---|
| 4,380,774 | 4/1983 | Yoder | 357/34 |
| 4,728,616 | 3/1988 | Ankri et al. | 148/DIG. 72 |
| 4,749,661 | 6/1988 | Bower | 357/34 |

FOREIGN PATENT DOCUMENTS
| | | | |
|---|---|---|---|
| 60-7771 | 1/1985 | Japan | 357/34 |
| 60-95966 | 5/1985 | Japan | 357/34 |
| 62-81759 | 4/1987 | Japan | 357/34 |
| 62-117369 | 5/1987 | Japan | 357/34 |

OTHER PUBLICATIONS
AlGaAs/GaAs Heterojunction Bipolar Transistors with Small Size Fabricated by a Multiple Self-Alignment Process Using One Mask IEEE Transactions on Electron Devices, vol. ED-34 No. 12, Dec. 1987.

GaAs/(Ga, Al) As Heterojunction Bipolar Transistors with Buried Oxygen-Implanted Isolation Layers IEEE Electron Device Letters, vol. EDL-5, No. 8, Aug. 1984.

Primary Examiner—Brian E. Hearn
Assistant Examiner—Tuan Nguyen
Attorney, Agent, or Firm—Wenderoth, Lind & Ponack

[57] ABSTRACT

A bipolar transistor with improved high-frequency performance is invented. The improvement is attained by eliminating a parasitic base-collector capacitance. The invented transistor is constructed upon a semi-insulating substrate, and wherein a region which underlies an extrinsic base region is semi-insulative such that the extrinsic base region does not substantially overlap the collector contact region and the collector region when viewed in the direction perpendicular to the substrate. Here, it's worthwhile to point out that a portion under the extrinsic base region is made completely semi-insulative down to the substrate. As a result, the transistor has substantially no parasitic base-collector capacitance. Also, a novel method, utilizing a self-align technique which uses a "first mask" for defining a collector contact region and a collector region, a "second mask" for defining an extrinsic base region, and a "third mask" determined by self-alignment using the first and the second mask for defining an emitter region, is disclosed to fabricate the bipolar transistor mentioned above.

6 Claims, 4 Drawing Sheets

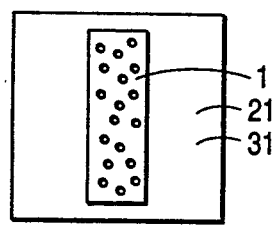
FIG. 3(a-1)
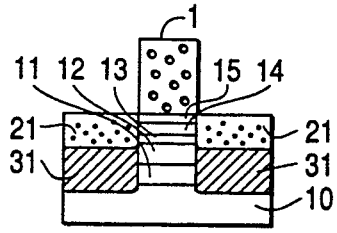
FIG. 3(b-1)
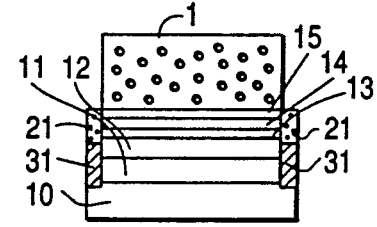
FIG. 3(c-1)
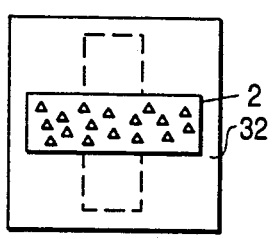
FIG. 3(a-2)
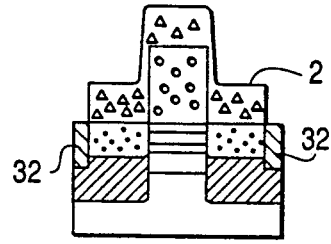
FIG. 3(b-2)
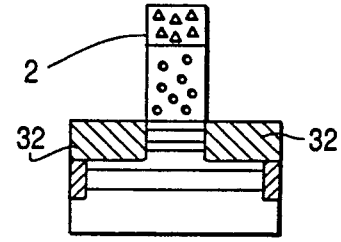
FIG. 3(c-2)
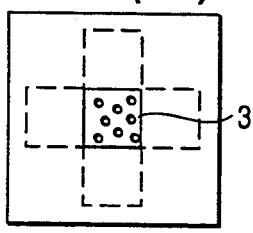
FIG. 3(a-3)
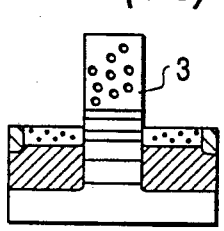
FIG. 3(b-3)
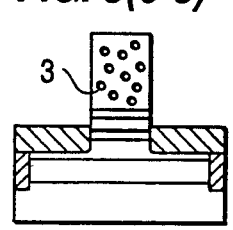
FIG. 3(c-3)
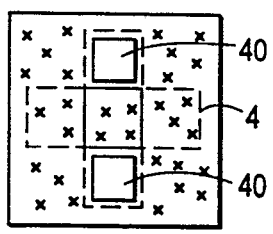
FIG. 3(a-4)
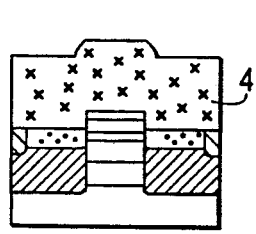
FIG. 3(b-4)
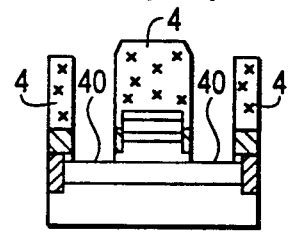
FIG. 3(c-4)
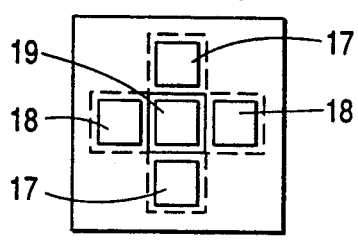
FIG. 3(a-5)
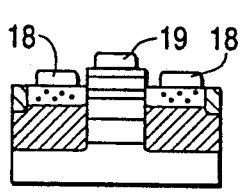
FIG. 3(b-5)
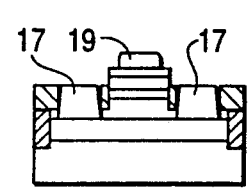
FIG. 3(c-5)

METHOD OF FABRICATING A HIGH-FREQUENCY BIPOLAR TRANSISTOR

This application is a division of now abandoned application Ser. No. 07/224,009 filed on Jul. 25, 1988, now abandoned.

BACKGROUND OF THE INVENTION

1. Field of the Invention

This invention relates to a transistor and more particularly to a high-frequency bipolar transistor, and to a method of fabricating the transistor.

2. Description of the Prior Art

A trend of semiconductor device technology is toward high speed and high frequency, as well as high integration. As is well-known, the high-frequency limitation of a bipolar transistor is usually described by the maximum oscillation frequency $f_{max}$, which is expressed as follows:

$$f_{max} = [4\pi(R_b C_{bc} t_{ec})^{\frac{1}{2}}]^{-1} \quad (1)$$

where $R_b$ is the base resistance, $C_{bc}$ is the base-collector junction capacitance and $t_{ec}$ is the emitter-to-collector delay time. Since $t_{ec}$ also contains the term proportional to $C_{bc}$, $f_{max}$ is especially sensitive to $C_{bc}$. Accordingly, the reduction of $C_{bc}$ is essential to improve the high-frequency performance of a bipolar transistor. In the case of an emitter-top transistor whose emitter is located on top of the transistor, $C_{bc}$ is expressed by the sum of an intrinsic capacitance $C_{bci}$ and a parasitic capacitance $C_{bcp}$, as follows:

$$C_{bc} = C_{bci} + C_{bcp} \quad (2)$$

The portion of a base region which underlies an emitter region is called an intrinsic base region, the rest of the base region, which is extended from the intrinsic base region, is called an extrinsic base region. Therefore, the intrinsic base region is an active region, and the extrinsic base region is an inactive region. $C_{bci}$ is the junction capacitance formed between the intrinsic base region and the collector region. $C_{bcp}$ is the junction capacitance formed between the extrinsic base region and the collector region. Reduction of $C_{bci}$ is, however, quite difficult because $C_{bci}$ is almost automatically determined by the requirement to realize a fundamental transistor action. Accordingly, the possible choice is limited to reduce $C_{bcp}$.

Recently, AlGaAs/GaAs heterojunction bipolar transistors (HBT's) have been attracting much interest because of its outstanding possibilities for high-frequency devices. In such HBT's, the bandgap of a material of the emitter region is wider than that of a material of the base region, so that the emitter-base junction forms a heterojunction. The principal advantage of the HBT's over Si homojunction bipolar transistors is that sufficiently high base-doping is possible without sacrificing the emitter injection efficiency, because the minority carrier injection from the base region to the emitter region is suppressed by the wider emitter bandgap of the heterojunction. Accordingly, both the base width and $R_b$ can simultaneously be reduced. As is well-known, the reduction of the base width is especially effective to decrease the base transit time, which is generally the most important component of $t_{ec}$. As a consequence, $f_{max}$ can be increased according to the formula (1). The other advantage is that the electron mobility of GaAs is faster than that of Si.

One of the conventional methods to reduce $C_{bcp}$ in HBT's is, as shown in FIG. 1, to introduce a semi-insulative region 20 between an extrinsic base region 21 and a collector contact region 11. (Ref. P. M. Asbeck, D. L. Miller, R. J. Anderson and F. H. Eisen, IEEE Electron Device Letters, vol. EDL-5, p. 310, 1984.) Here the semi-insulative region means that its resistivity is sufficiently high compared with those of n-type or p-type transistor regions. In the prior art cited above, a collector contact region 11 made of $n^+$-GaAs, a collector region 12 made of n-GaAs, a base region 13 made of $p^+$-GaAs, an emitter region 14 made of n-AlGaAs and an emitter contact region 15 made of $n^+$-GaAs are fabricated in this order on a semi-insulating (s. i.) substrate 10. $Be^+$ is implanted in the extrinsic base region 21 to reduce $R_b$. A collector electrode 17, double base-electrodes 18 and an emitter electrode 19 are formed upon the collector contact region 11, the extrinic base region 21 and the emitter contact region 15, respectively. The conduction property of the portion 20 sandwiched between the extrinsic base region 21 and the collector contact region 11 is changed from n-type to semi-insulative by $0^+$ implantation. Accordingly, $C_{bcp}$ is reduced as the base-collector junction is thus changed from $p^+$-n to $p^+$-i-$n^+$.

In the above structure, however, the reduction of $C_{bcp}$ is limited to a certain extent, because the overlap between the extrinsic base region 21 and the collector contact region 11, which makes the $p^+$-i-$n^+$ junction, still remains.

SUMMARY OF THE INVENTION

An object of this invention is to improve the high-frequency performance of a emitter-top (collector-top) bipolar transistor by eliminating the parasitic capacitance $C_{bcp}$ ($C_{bep}$) of a bipolar transistor.

This object is accomplished by a transistor which is constructed upon a semi-insulating substrate and wherein the region which underlies the extrinsic base region is semi-insulative such that the extrinsic base region does not substantially overlap the collector (emitter) contact region and the collector (emitter) region when viewed in the direction perpendicular to the substrate. Here, it's worthwhile to point out that a portion under the extrinsic base region is made completely semi-insulative down to the substrate. As a result, the transistor has substantially no parasitic capacitance $C_{bcp}$ ($C_{bep}$).

Another object of this invention is to provide a novel method which fabricates the bipolar transistor mentioned above.

This object is accomplished in a self-align technique which uses a "first mask" for defining the collector (emitter) contact region and the collector (emitter) region, a "second mask" for defining the extrinsic base region, and a "third mask" determined by self-alignment using the first and second masks for defining the emitter (collector) region.

BRIEF DESCRIPTION OF THE DRAWING

FIG. 3 shows schematic self-aligned processing steps of this invention, where the viewpoints of (a-), (b-) and (c-) correspond to those of (a), (b) and (c) of FIG. 2, respectively.

DESCRIPTION OF THE PREFERRED EMBODIMENTS

Figure 1:
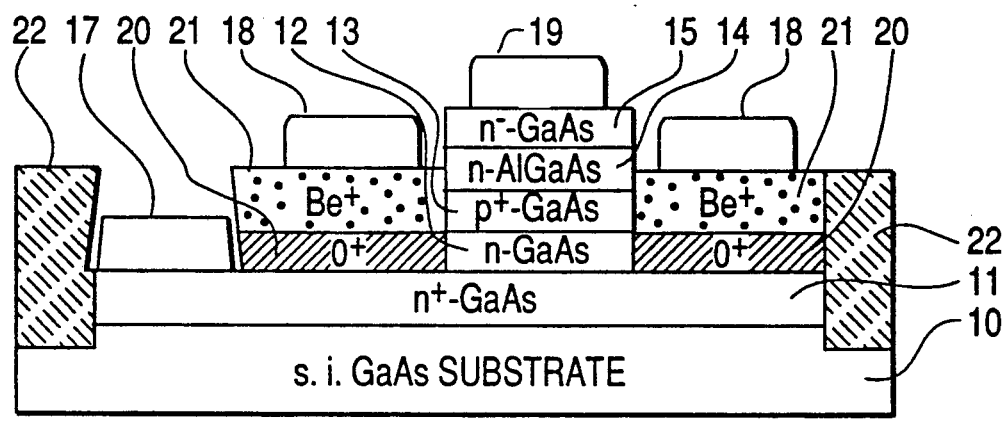
FIG. 1 is a cross-sectional view of a conventional GaAs bipolar transistor.
Figure 2A:
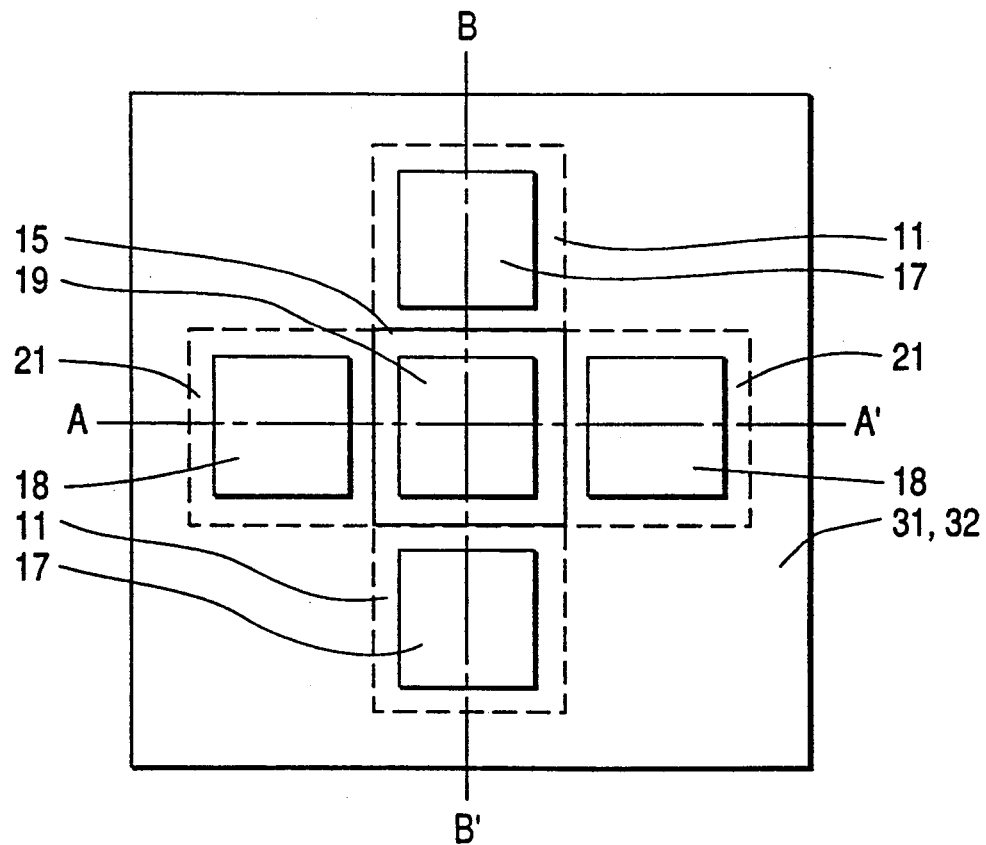
FIG. 2 is schematic views of an emitter-top GaAs bipolar transistor improved with this invention; (a) is a top view of the transistor seen in the direction perpendicular to a substrate; (b) is a cross-sectional view of the same transistor cut at A—A'; (c) is a cross-sectional view of the same transistor cut at B—B'.
Figure 2B:
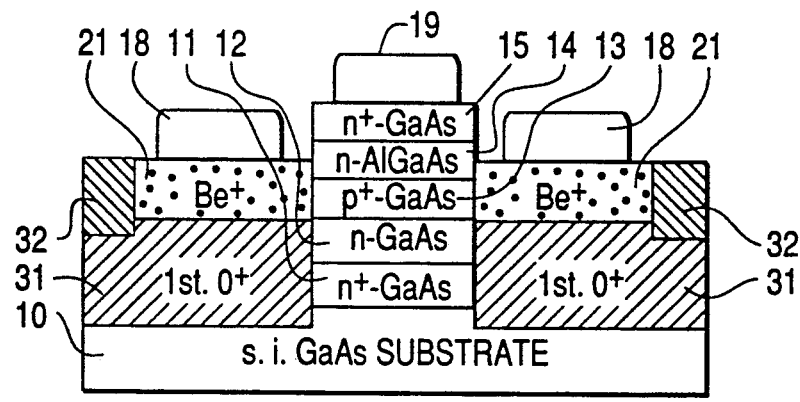
Figure 2C:
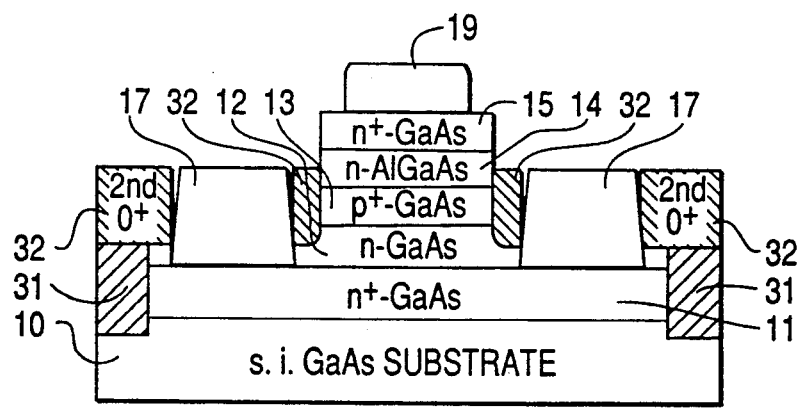

The transistor improved with the present invention is shown FIG. 2, taking up an emitter-top HBT with double base-electrodes and double collector-electrodes as an embodiment.

The transistor is constructed upon a semi-insulating substrate 10. A collector contact region 11, a collector region 12, an intrinsic base region 13, an emitter region 14 and an emitter contact region 15 are formed on the substrate 10 in this order. An extrinsic base region 21 is formed on a first semi-insulative region (1st. $0^+$) 31. A second semi-insulative region (2nd. $0^+$) 32 is formed around the extrinsic base region 21. Double collector-electrodes 17, double base-electrodes 18 and an emitter electrode 19 are formed on the collector contact region 11, the extrinsic base region 21 and the emitter contact region 15, respectively. Here, to reduce both the collector resistance $R_c$ and the base resistance $R_b$, both the collector electrodes 17 and the base electrodes 18 are divided into two portions arranged at both sides of the emitter region 14.

A fabrication method of the transistor is described along FIG. 3. The method, utilizing self-align technique, is especially suitable for realizing the proposed transistor. The process steps are as follows.

First of all, a multilayer structure is constructed by means of, for example, molecular-beam epitaxy. This multilayer structure comprises an $n^+$-GaAs (e.g., $5 \times 10^{18}$ cm$^{-3}$ doped, 0.5 μm thick) collector contact layer, an n-GaAs (e.g., $5 \times 10^{16}$ cm$^{-3}$ doped, 0.4 μm thick) collector layer, a $p^+$-GaAs (e.g., $2 \times 10^{19}$ cm$^{-3}$ doped, 0.1 μm thick) base layer, an n-AlGaAs (e.g., $1 \times 10^{18}$ cm$^{-3}$ doped, 0.2 μm thick) emitter layer and an $n^+$-GaAs (e.g., $5 \times 10^{18}$ cm$^{-3}$ doped, 0.1 μm thick) emitter contact layer, which are stacked on a semi-insulating GaAs substrate 10 in this order. This initial structure is not shown in FIG. 3.

Then, in order to define a collector contact region 11 and a collector region 12, the portions 31 of the collector contact layer and the collector layer are changed semi-insulative by deep-implanting $0^+$ (e.g., $1 \times 10^{15}$ cm$^{-2}$ dosed at an energy of 500 keV) from the surface of the multilayer structure, using SiO$_2$ 1 (e.g., 2 μm thick) as a mask (see FIG. 3 (a-1), (b-1) and (c-1)). For convenience, the portion 31 is called "first $0^+$-implanted region", and the mask made of SiO$_2$ 1 is called "first mask". Accordingly, the initial collector contact layer and collector layer are divided into the collector contact region 11, the collector region 12 and the first $0^+$-implanted region 31. The transistor region with the highest resistivity, that is the collector region 12, shows resistivity of about 0.03 Ω·cm, whereas the semi-insulative region 31 prepared according to the above condition shows resistivity of about $10^5$ Ω·cm, which is in fact sufficiently higher than the former.

After that, to reduce an extrinsic base resistance, the region 21 upon the first $0^+$-implanted region 31 is ion-implanted with Be$^+$ (e.g., $1 \times 10^{14}$ cm$^{-2}$ dosed at an energy of 100 keV), again using the first mask 1, as shown in FIG. 3 (a-1), (b-1) and (c-1). The region 21 becomes p-type by this Be$^+$ implantation. Part of the region 21 is to become an extrinsic base region 21 in the next step. Here, it's worthwhile to point out that a portion under the region 21 has been made completely semi-insulative down to the substrate 10 (see FIG. 3 (a-2), (b-2) and (c-2)).

As a next step, the extrinsic base region 21 in which Be$^+$ has been implanted is defined as follows. The second mask 2 made of Al (e.g., 1 μm thick) is formed on top of the multilayer structure, which crosses over the first mask 1 as shown in FIG. 3 (a-2). Then the part of the first mask 1 which is not covered with the second mask 2 is removed by dry etching (e.g., reactive ion etching of CHF$_3$). After that, the portion 32 which is not covered with the second mask 2 is changed semi-insulative by shallow-implanting $0^+$ (e.g., $1 \times 10^{15}$ cm$^{-2}$ dosed at an energy of 200 keV). For convenience, the portion 32 is called "second $0^+$-implanted region".

As a next step, an emitter region 14 and an emitter contact region 15 are defined with self-alignment technique as follows. Removing the second mask 2 by wet etching (e.g., HCl), SiO$_2$ 3 is exposed as shown in FIG. 3 (a-3). The SiO$_2$ 3 is the part of the first mask 1 which have been covered with the second mask 2. Then the initial emitter layer and emitter contact layer are removed by wet etching (e.g., H$_2$SO$_4$:H$_2$O$_2$:H$_2$O=1:1:12) using the SiO$_2$ 3 as a mask (see FIG. 3 (a-3), (b-3) and (c-3)). For convenience, the SiO$_2$ 3 is called "third mask". As is described above, the shape of the third mask is determined by the first and second mask, that is, determined by self-alignment. This self-alignment ensures the extrinsic base region 21 not to overlap the collector contact region 11 and the collector region 12 at all. As a result, the parasitic capacitance $C_{bcp}$ can be substantially eliminated.

After removing the third mask 3 by wet etching (e.g., HF), the sample is annealed (e.g., 800° C. for 10 seconds) to recrystallize all of the implanted regions 21, 31 and 32.

Then, the collector, emitter and base electrodes are formed in this order. Via holes 40 reaching the collector contact region 11 are first formed by wet etching using photoresist 4 as a mask, as shown in FIG. 3 (a-4), (b-4) and (c-4). Then evaporating AuGe/Ni/Au and using lift-off technique by resist 4, the double collector-electrodes 17 are formed upon the collector contact region 11. The emitter electrode 19 is next formed upon the emitter contact region 15 by evaporating the same metal and using lift-off technique. After alloying the electrodes 17 and 19 with heat treatment, the double base-electrodes 18 are last formed upon the extrinsic base region 21 by evaporating AuZn/Au and using lift-off technique (see FIG. 3 (a-5), (b-5) and (c-5)).

In case that the transistor described above is applied to integration circuits, each of the electrodes 17, 18 and 19 is led to an outer area by multi-level metallization technique.

The HBT improved with this invention is easily fabricated with the self-aligned process as described above. The structure and the process have the following advantages: (1) the invented transistor has substantially no base-collector parasitic capacitance $C_{bcp}$; (2) the above fabrication method utilizes simple but useful self-alignment technique, owing to which the extrinsic base region 21 does not substantially overlap the collector contact region 11; (3) excessive device isolation process for integration circuits needs not be formed because each transistor area is defined by the first mask and the second mask in this process; (4) the layout scheme of the base and the collector electrodes can be set up freely.

Figure 4:
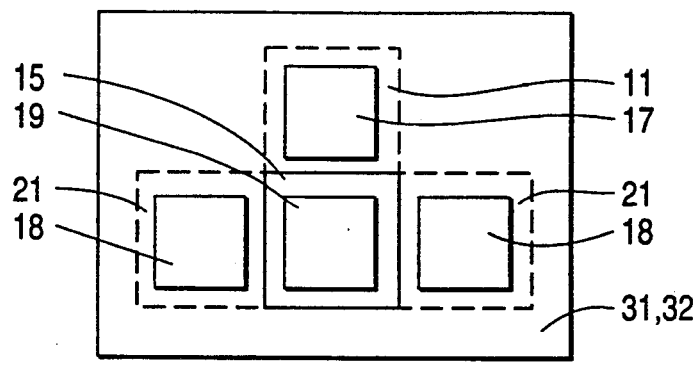
FIGS. 4, 5 and 6 show the top views of three variations of the GaAs bipolar transistors improved with this invention.
Figure 5:
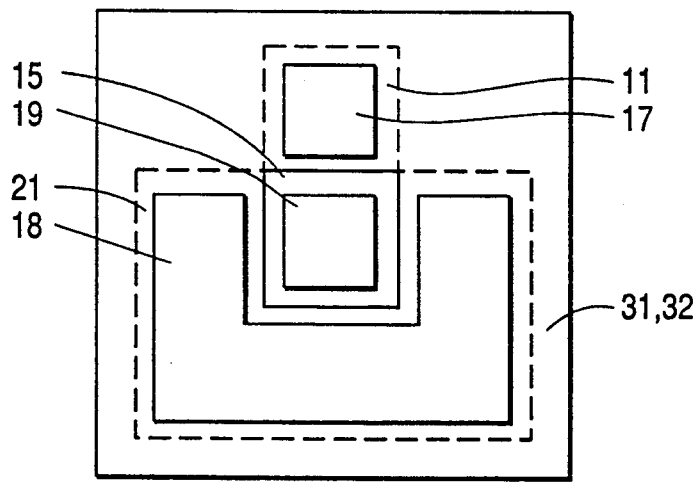
Figure 6:
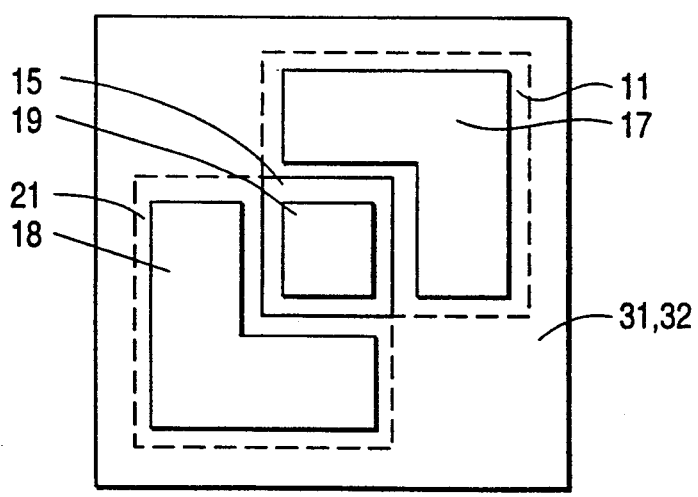

FIGS. 4, 5 and 6 show top views of other layout schemes of those electrodes. The HBT shown in FIG. 4 has a single collector-electrode. This transistor has an advantage that each of the electrodes can be directly led to an outer area without multi-level metallization technique. The HBT shown in FIG. 5 has a single collector-electrode 17 and a single base-electrode 18. In this transistor, the base electrode 18 which surrounds the emitter contact region 15 is very effective to reduce $R_b$. The HBT shown in FIG. 6 has an single collector-electrode 17 and an single base-electrode 18, which both surround the emitter contact region 15. The scheme of this transistor enables to reduce the $R_c$ and $R_b$ even if adopting a single electrode configuration.

In the previously-mentioned process, the $Be^+$-implanting step is not necessary if the conditions of the first deep $O^+$-implanting are decided such that this implantation does not affect the extrinsic base region. Also, the implanting ions other than $O^+$ and $Be^+$ may be used. For example, $B^+$, $H^+$, $N^+$ or $Cr^+$ may be used to form the semi-insulative region in place of $O^+$, and $Mg^+$, $Zn^+$ or $C^+$ may be used to form a p-type region in place of $Be^+$. The conditions of ion implanting and annealing depend on the kind of the implanting ions and on the thickness and doping of the multilayer structures.

The HBT may be fabricated by other method than that described above. For example, the extrinsic base region may be delineated by wet etching, instead of the second $O^+$-implanting.

The previously-mentioned structure and process can be applied to a homojunction bipolar transistor without any alteration, and also to a collector-top transistor whose collector is located on top of the transistor. In the collector-top transistor, the reduction of the parasitic base-emitter capacitance $C_{bep}$ becomes important, just like the reduction of the parasitic base-colletor capacitance $C_{bcp}$ was important in the emitter-top transistor.

Figure 7:
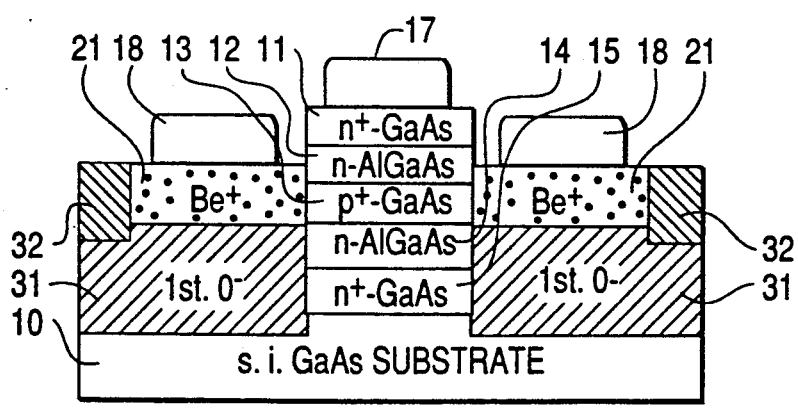
FIG. 7 is a cross-sectional view of a collector-top GaAs bipolar transistor improved with this invention.

FIG. 7 shows another embodiment of the present invention applied to a collector-top transistor. An emitter contact region 15, an emitter region 14, a base region 13, a collector region 12 and a collector contact region 11 are formed on a semi-insulating substrate 10 in this order, and a first $O^+$-implanted region 31, a second $O^+$-implanted region 32 and a $Be^+$-implanted region 21 are also formed by the self-aligned process described above. That is, in the description of the process made in connection with FIG. 2 and FIG. 3, the terms "emitter" and "collector" may be changed to "collector" and "emitter", respectively, to form the transistor shown in FIG. 7. Obviously, $C_{bep}$ is essentially eliminated with the concept of the present invention.

What is claimed is:

1. A method of fabricating a bipolar transistor comprising the steps of:
   1) forming a multilayer structure by sequentially stacking on a semi-insulating substrate, a collector contact layer, a collector layer, a base layer, and an emitter layer in this order;
   2) forming a first mask on a part of the multilayer structure;
   3) changing the collector contact layer and the collector layer to be a first semi-insulative region by a deep ion-implantation at portions except for portions below the first mask so that the portions of the collector contact layer and the collector layer below the first mask become a collector contact region and a collector region, respectively;
   4) forming a second mask on a part of the multilayer structure to partly overlap a part of the first mask;
   5) removing the first mask except for the part overlapped with the second mask;
   6) changing the base layer to be second semi-insulative region by a shallow ion-implantation at a portion except for a portion below the second mask so that the portion of the base layer below the second mask becomes a base region having an extrinsic base region formed on the first semi-insulative region;
   7) removing the second mask so that the part of the first mask which was overlapped with the second mask remains as a third mask;
   8) etching off the emitter layer at a portion except for a portion below the third mask so that the portion of the emitter layer below the third mask remains as an emitter region; and
   9) removing the third mask.

2. The method of claim 1, wherein the bandgap of a material of the emitter layer described in the step 1) is wider than that of a material of the base layer.

3. The method of claim 1, further comprising, between the step 3) and step 4), an additional step of implanting ions into the extrinsic base region upon the first semi-insulative region such that the resistance of said extrinsic base region is reduced.

4. A method of fabricating a bipolar transistor comprising the steps of:
   1) forming a multilayer structure by sequentially stacking on a semi-insulating substrate, an emitter contact layer, an emitter layer, a base layer, and a collector layer in this order;
   2) forming a first mask on a part of the multilayer structure;
   3) changing the emitter contact layer and the emitter layer to be a first semi-insulative region by a deep ion-implantation at portions except for portions below the first mask so that the portions of the emitter contact layer and the emitter layer below the first mask become an emitter contact region and an emitter region, respectively;
   4) forming a second mask on a part of the multilayer structure to partly overlap a part of the first mask;
   5) removing the first mask except for the part overlapped with the second mask;
   6) changing the base layer to be a second semi-insulative region by a shallow ion-implantation at a portion except for a portion below the second mask so that the portion of the base layer below the second mask becomes a base region having an extrinsic base region formed on the first semi-insulative region;
   7) removing the second mask so that the part of the first mask which was overlapped with the second mask remains as a third mask;
   8) etching off the collector layer at a portion except for a portion below the third mask so that the portion of the collector layer below the third mask remains as a collector region; and
   9) removing the third mask.

5. The method of claim 4, wherein the bandgap of a material of the emitter layer described in the step 1) is wider than that of a material of the base layer.

6. The method of claim 4, further comprising, between the step 3) and the step 4), an additional step of implanting ions into the extrinsic base region upon the first semi-insulative region such that the resistance of said extrinsic base region is reduced.

* * * * *